(12) United States Patent
Park et al.

(10) Patent No.: US 8,877,650 B2
(45) Date of Patent: Nov. 4, 2014

(54) METHODS OF MANUFACTURING SEMICONDUCTOR DEVICES AND OPTICAL PROXIMITY CORRECTION

(75) Inventors: O Seo Park, Hopewell Junction, NY (US); Wai-Kin Li, Poughkeepsie, NY (US)

(73) Assignees: International Business Machines Corporation, Armonk, NY (US); Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/480,317

(22) Filed: May 24, 2012

(65) Prior Publication Data

US 2012/0228743 A1 Sep. 13, 2012

Related U.S. Application Data

(62) Division of application No. 11/960,406, filed on Dec. 19, 2007, now Pat. No. 8,187,974.

(51) Int. Cl.
*H01L 21/302* (2006.01)
*H01L 21/311* (2006.01)
*H01L 21/66* (2006.01)
*G03F 1/36* (2012.01)
*G03F 1/00* (2012.01)

(52) U.S. Cl.
CPC .......... *H01L 21/31144* (2013.01); *H01L 22/12* (2013.01); *G03F 1/36* (2013.01); *H01L 22/20* (2013.01); *G03F 1/144* (2013.01)

USPC .......... 438/710; 438/689; 438/692; 438/717; 257/E21.249; 216/37; 216/67

(58) Field of Classification Search
USPC ................. 438/689, 692, 710, 717, 723–725; 257/E21.249; 216/37, 67
See application file for complete search history.

(56) References Cited

U.S. PATENT DOCUMENTS

| 6,838,381 B2 * | 1/2005 | Hsu et al. ..................... 438/682 |
| 6,927,173 B2 | 8/2005 | Mori et al. |
| 2008/0032204 A1 * | 2/2008 | Herold ............................ 430/5 |
| 2009/0068767 A1 * | 3/2009 | Sirard et al. ..................... 438/8 |

OTHER PUBLICATIONS

Nicolas Cobb, Ph.D. Thesis, University of California at Berkley, (1998), pp. 1-13.*
"Sheet Resistance," EE 105, Lecture 4, 1997, 8 pp., Johns Hopkins University School of Electrical and Computer Engineering, Baltimore, MD.

(Continued)

*Primary Examiner* — Duy Deo
*Assistant Examiner* — Maki Angadi
(74) *Attorney, Agent, or Firm* — Slater & Matsil, L.L.P.

(57) ABSTRACT

Methods of manufacturing semiconductor devices and methods of optical proximity correction methods are disclosed. In one embodiment, a method of manufacturing a semiconductor device includes determining an amount of reactive ion etch (RIE) lag of a RIE process for a material layer of the semiconductor device, and adjusting a size of at least one pattern for a feature of the material layer by an adjustment amount to partially compensate for the amount of RIE lag determined.

18 Claims, 5 Drawing Sheets

(56) References Cited

OTHER PUBLICATIONS

"Sheet Resistance," http://www.ece.gatech.edu/research/labs/vc/theory/sheetRes.html, downloaded Dec. 18, 2007, pp. 1-2, Georgia Institute of Technology School of Electrical and Computer Engineering, Atlanta, GA.

Cheung, N., "Reactive Ion Etching (RIE)," EE143 Lecture #16, http://www.atechsystem.co.kr/custom/rie.pdf, 28 pp., downloaded Jan. 7, 2008, U.C. Berkeley, Berkeley, CA.

Keil, D., et al., "Characterization of Reactive Ion Etch Lag Scaling," Journal of Vacuum Science & Technology B 19(6), Nov./Dec. 2001, pp. 2082-2088.

* cited by examiner

METHODS OF MANUFACTURING SEMICONDUCTOR DEVICES AND OPTICAL PROXIMITY CORRECTION

This is a divisional application of U.S. application Ser. No. 11/960,406, entitled "Methods of Manufacturing Semiconductor Devices and Optical Proximity Correction," which was filed on Dec. 19, 2007 (now U.S. Pat. No. 8,187,974) and is incorporated herein by reference.

TECHNICAL FIELD

The present invention relates generally to the fabrication of semiconductor devices, and more particularly to methods of manufacturing semiconductor devices and methods of optical proximity correction (OPC) in lithography used to manufacture semiconductor devices.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various layers using lithography and etch processes to form circuit components and elements thereon.

There is a trend in the semiconductor industry towards reducing the size of features, e.g., the circuits, elements, conductive lines, and vias of semiconductor devices, in order to improve the performance of the semiconductor devices, for example. The minimum feature size of semiconductor devices has steadily decreased over time. As feature sizes diminish, the patterning of conductive lines, transistor gates, and other circuit components becomes more challenging.

In particular, as feature sizes are reduced, the transfer of patterns of lithography masks to semiconductor devices may become inaccurate. Diffraction and other effects in a lithography process or system may cause features formed on semiconductor devices to appear differently than patterns on a lithography mask.

Lithography techniques such as optical proximity correction (OPC) are sometimes used in an attempt to alleviate mask transfer problems. In OPC, serifs are formed on patterns in a mask or the widths or lengths of portions of patterns on a mask are adjusted to achieve the desired widths and lengths of features on a semiconductor device, e.g., from a top view of the wafer. However, in some applications, these OPC methods have not been shown to adequately solve mask pattern transfer problems in lithography processes.

Thus, what are needed in the art are improved methods of manufacturing semiconductor devices and methods of OPC.

SUMMARY OF THE INVENTION

These and other problems are generally solved or circumvented, and technical advantages are generally achieved, by embodiments of the present invention, which provide novel methods of manufacturing semiconductor devices and novel methods of OPC.

In accordance with an embodiment of the present invention, a method of manufacturing a semiconductor device includes determining an amount of reactive ion etch (RIE) lag of a RIE process for a material layer of the semiconductor device, and adjusting a size of at least one pattern for a feature of the material layer by an adjustment amount to partially compensate for the amount of RIE lag determined.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments of the present invention and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in specific contexts, namely implemented in the formation of conductive lines and test structures. Embodiments of the invention may also be implemented in other semiconductor applications to form other conductive features, such as transistor gates, capacitors, inductors, and other devices, for example.

One type of etch process used in semiconductor device manufacturing is referred to as a reactive ion etch (RIE) process. RIE processes use plasma having high energy ions that attack exposed areas of a wafer and react with it, etching portions of the material away. RIE lag is a phenomenon that occurs when small features are patterned using a RIE process. RIE lag results in large features being etched deeper than small features, due to the nature of the RIE process. For example, large features with a wider opening at the top surface of the wafer consume more etchant than small features having a narrower opening, resulting in a local loading effect and causing wider patterns to have a greater depth than narrow patterns.

Embodiments of the present invention achieve technical advantages by adjusting the lateral dimensions of a lithography mask, e.g., in an OPC process, in order to partially offset or compensate for RIE lag effects that form undesired vertical dimensions or depths within a surface of a semiconductor device. In accordance with one embodiment, for example, an amount of RIE lag of a RIE process for a material layer of a semiconductor device is determined, and a size of at least one pattern for a feature of the material layer is adjusted by an adjustment amount to compensate for the amount of RIE lag determined.

Figure 1:
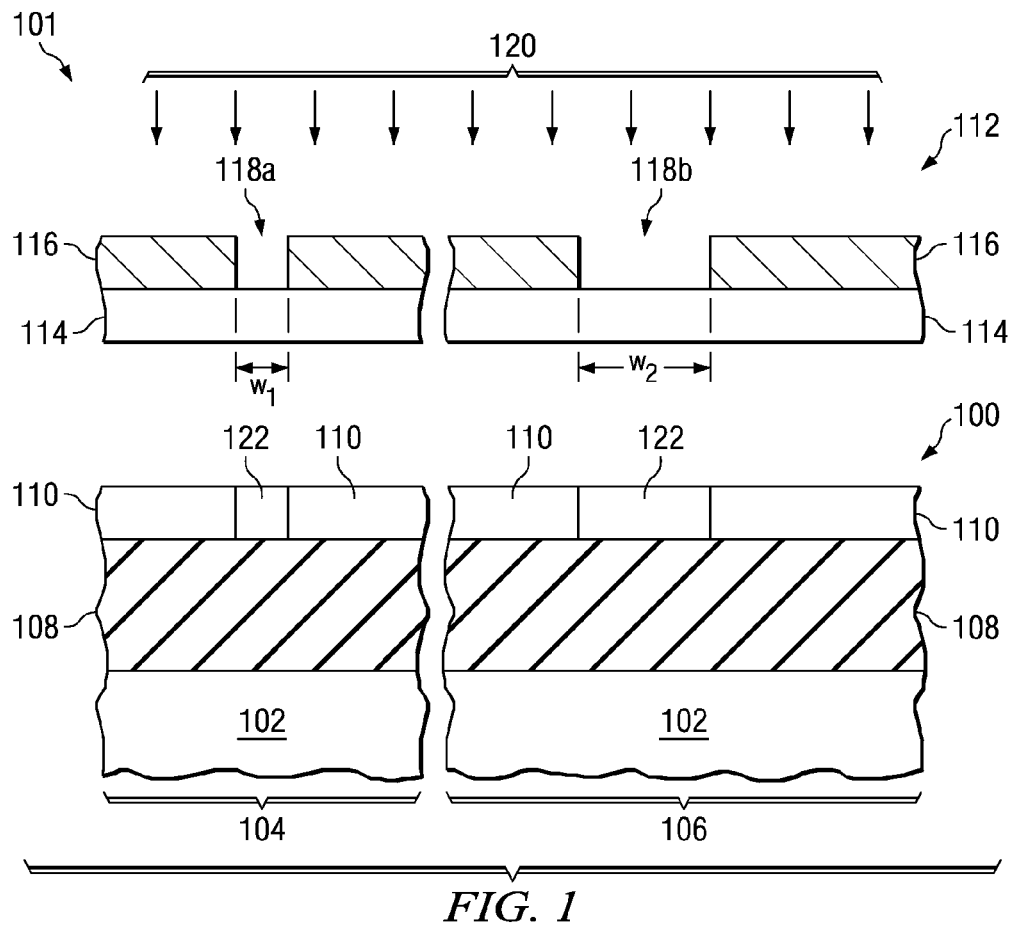
FIGS. 1 through 5 show cross-sectional views of a semiconductor device at various stages of manufacturing in accordance with an embodiment of the present invention, wherein patterns with wide openings are etched deeper than patterns with narrower openings due to RIE lag.

FIGS. 1 through 5 show cross-sectional views of a semiconductor device 100 at various stages of manufacturing in accordance with an embodiment of the present invention, wherein patterns 118b with wide openings are etched deeper than patterns 118a with narrower openings due to RIE lag. Referring first to FIG. 1, in accordance with an embodiment of the present invention, a layout for a material layer 108 of a semiconductor device 100 is first determined. The layout may comprise a pattern for a plurality of conductive lines or test structures that will be formed in a damascene process within the material layer 108, for example. However, alternatively, the pattern may comprise a pattern for other types of circuit elements or devices.

The layout may be formed on a lithography mask 112, shown in a cross-sectional view in FIG. 1. The layout includes at least one pattern 118a for a first feature and at least one pattern 118b for a second feature. The lithography mask 112 is used to pattern the material layer 108 of the semiconductor device 100 using a lithography system, for example. Only a portion 101 of a lithography system is shown in FIG. 1: the lithography system may also include a support for the semiconductor device 100, a lens system, an illuminator, a stepper or scanner, and other elements, for example, not shown.

The semiconductor device 100 shown in the cross-sectional view in FIG. 1 comprises a workpiece 102. The workpiece 102 may include a semiconductor substrate or body comprising silicon or other semiconductor materials covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may comprise a silicon-on-insulator (SOI) substrate, for example.

The workpiece 102 includes a first region 104 and a second region 106, as shown. The first region 104 will have narrow features formed therein, and the second region 106 will have wide features formed therein. Only one narrow feature is shown in the first region 104, and only one wide feature is shown in the second region 106 (e.g., features 130a and 130b shown in FIG. 5), although alternatively, a plurality of narrow features and wide features may be formed in the first region 104 and the second region 106, respectively. There may be a plurality of first region 104 and second regions 106 across the surface of the workpiece 102, for example, not shown.

A material layer 108 is formed over the workpiece 102. If the features to be formed in the material layer 108 comprise conductive lines, the material layer 108 preferably comprises an insulating material such as $SiO_2$, tetra ethyl oxysilane (TEOS), or other insulators. The material layer 108 may comprise a low dielectric constant (k) dielectric material having a k value of less than about 3.9, for example. The material layer 108 may comprise multiple layers of materials, and may include one or more liners and/or one or more etch stop layers, for example, not shown. Alternatively, the material layer 108 may comprise a conductive material, a semiconductive material, or other materials, as examples.

A layer of photosensitive material 110 is formed over the material layer 108. The layer of photosensitive material 110 may comprise a positive or negative photoresist, for example.

The lithography mask 112 may comprise a binary mask comprising a substantially transparent material 114 comprising a substrate and a substantially opaque material 116 disposed over the transparent material 114. The opaque material 116 is patterned with the patterns 118a and 118b for the features to be formed in the material layer 108. The patterns 118a and 118b may comprise apertures, e.g., comprising rectangular-shaped elongated holes in the opaque material 116, for example. The patterns 118a and 118b may alternatively comprise other shapes. The opaque material 116 comprising the patterns 118a and 118b may comprise chromium (Cr), and the transparent substrate 114 may comprise quartz or glass, as examples, although alternatively, other materials may be used for the opaque material 116 and the transparent substrate 114. The lithography mask 112 may alternatively comprise other types of masks, such as phase shifting masks, alternating phase shifting masks, attenuating phase shifting masks, bright field masks, dark field masks, immersion lithography masks, combinations thereof, or combinations thereof with binary masks, as examples, although other types of masks 112 may also be used.

The lithography system used to pattern the layer of photosensitive material 110 may comprise a magnification of 1:1, 2:1, or 4:1, as examples, although alternatively, other magnification factors may also be used. The lithography system may comprise a lithography system that utilizes ultraviolet (UV) or extreme UV (EUV) light, an optical lithography system, an x-ray lithography system, an interference lithography system, or an immersion lithography system, as examples, although alternatively, other lithography systems may also be used.

The patterns 118a of the mask 112 that are used to pattern the material layer 108 in the first region 104 comprise a first width $w_1$, and the patterns 118b of the mask 112 that are used to pattern the material layer 108 in the second region 106 comprise a second width $w_2$, wherein the second width $w_2$ is greater than the first width $w_1$. In some embodiments, the second width $w_2$ is about three times greater than the first width $w_1$, for example, although alternatively, the second width $w_2$ may comprise other dimensions. The first width $w_1$ may comprise a minimum feature size of the semiconductor device 100, for example, in some embodiments, although alternatively, the first width $w_1$ may comprise other dimensions.

To transfer the pattern of the mask 112 to the layer of photosensitive material 110, the semiconductor device 100 is exposed to energy 120 using the lithography mask, e.g., through the lithography mask 112. The energy 120 may comprise light or radiation, as examples. The energy 120 exposes portions 122 of the layer of photosensitive material 110, as shown in FIG. 1. The layer of photosensitive material 110 is developed, and exposed portions 122 are removed (or unexposed portions are removed, depending on whether the layer of photosensitive material 110 comprises a positive or negative photoresist, for example), leaving patterns in the layer of photosensitive material 110 that correspond to the patterns 118a and 118b of the mask 112, as shown in FIG. 2.

Figure 2:
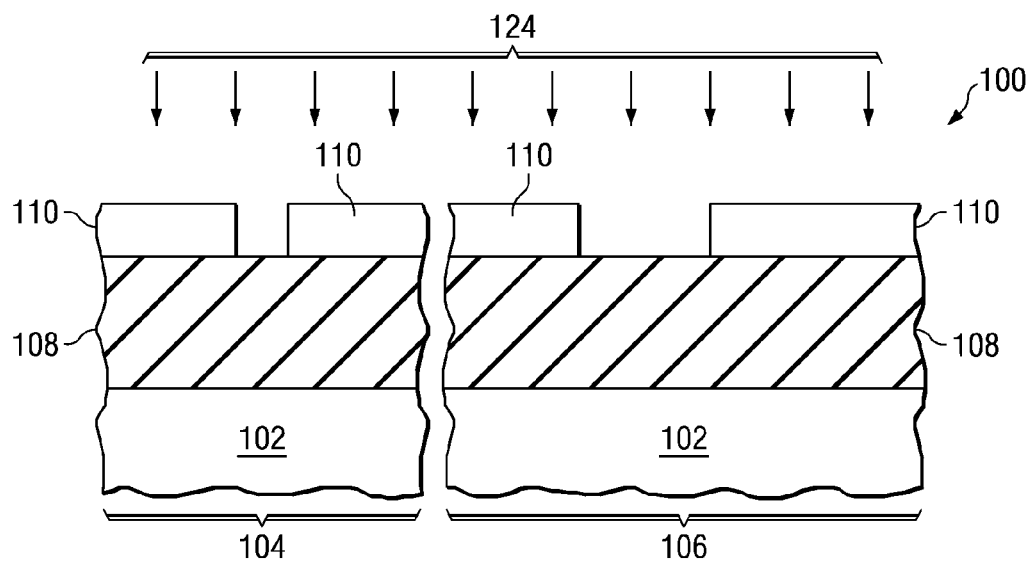

The semiconductor device 100 is exposed to an etch process 124 to pattern the material layer 108, also shown in FIG. 2. Exposed portions of the material layer 108 are etched away by the etch process 124. The etch process 124 preferably comprises a RIE process in accordance with an embodiment of the present invention, for example. The semiconductor device 100 after the etch process 124 is shown in FIG. 3, wherein the patterns in the layer of photosensitive material 110 have been transferred to the material layer 108.

Figure 3:
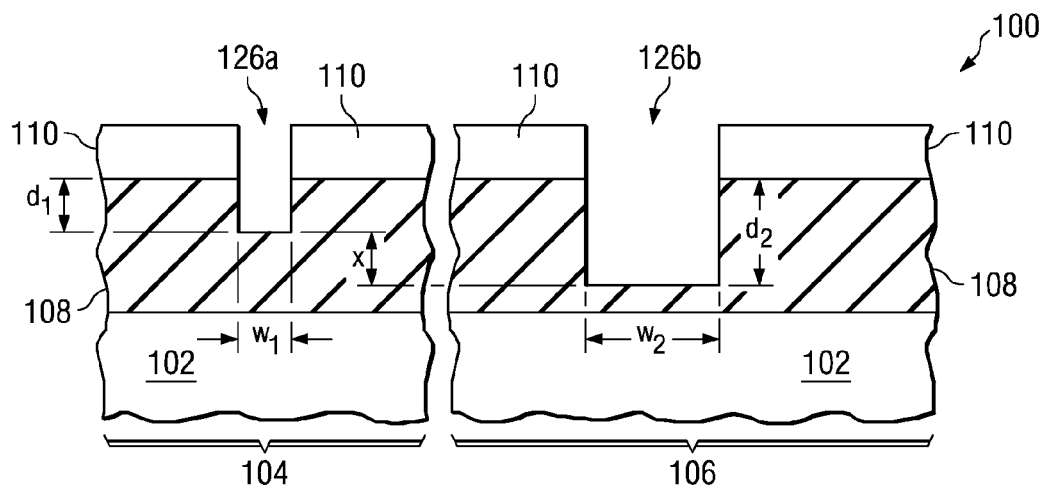

FIG. 3 illustrates the effect of RIE lag in the patterns formed in the first region 104 and the second region 106 of the semiconductor device 100. Because the patterns 126a in the first region 104 are narrower and comprise a first width $w_1$ corresponding to the first width $w_1$ of the mask 112, the patterns 126a in the first region 104 comprise a first depth $d_1$ that is less than the second depth $d_2$ of the patterns 126b formed in the second region 106 comprising a second width $w_2$ corresponding to the second width $w_2$ of the mask 112. The wider second width $w_2$ compared to the first width $w_1$ of the patterns 126b causes the second depth $d_2$ to be deeper than the first depth $d_2$, after the etch process 124. The amount of RIE lag comprises an amount x that is the difference between the second depth $d_2$ of the wide patterns 126b in the second region 106 and the first depth $d_1$ of the narrow patterns 126a in the first region 104, for example.

Figure 4:
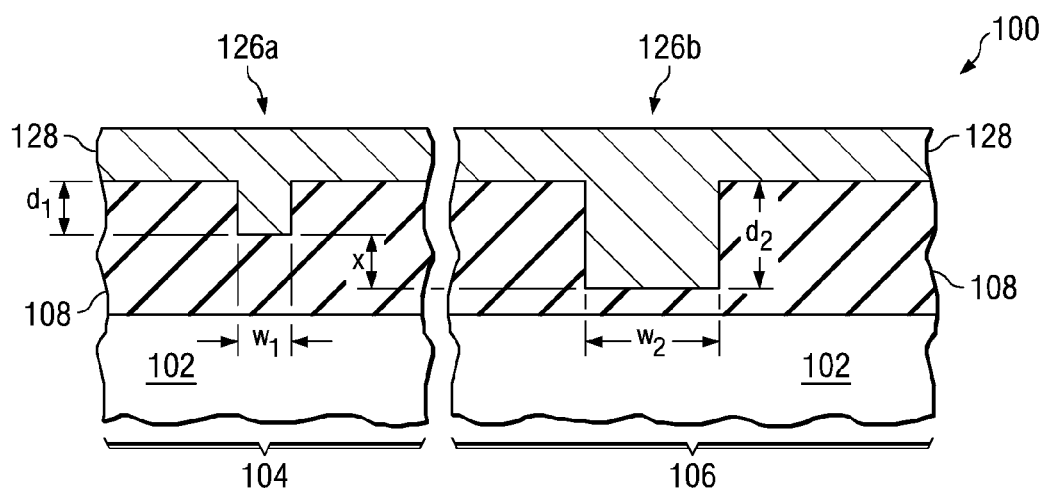

The layer of photosensitive material 110 is removed, and a conductive material 128 is disposed over the patterned material layer 108, as shown in FIG. 4. The conductive material 128 may comprise copper, aluminum, other metals, or alloys thereof, as examples, although alternatively, the conductive material 128 may comprise other materials. The conductive material 128 may also include one or more liners or seed layers, for example, not shown.

Figure 5:
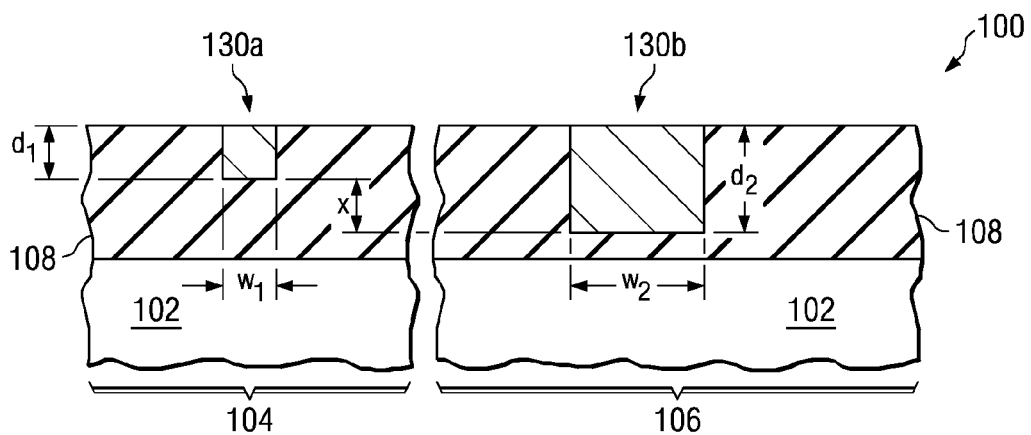

Excess conductive material 128 is removed from the top surface of the patterned material layer 108, e.g., using an etch process and/or chemical-mechanical polish process, leaving features 130a and 130b formed in the material layer 108 in the first region 104 and the second region 106, respectively, as shown in FIG. 5. The features 130a in the first region 104 comprise conductive lines or test structures having the first width $w_1$ and a first depth $d_1$. The features 130b in the second region 106 comprise conductive lines or test structures having a second width $w_2$ and a second depth $d_2$, wherein the second depth $d_2$ is greater than the first depth $d_1$ by an amount x that represents the amount of RIE lag of the RIE process used to pattern the material layer 108. The features 130a and 130b may also comprise other circuit elements, for example.

Figure 6:
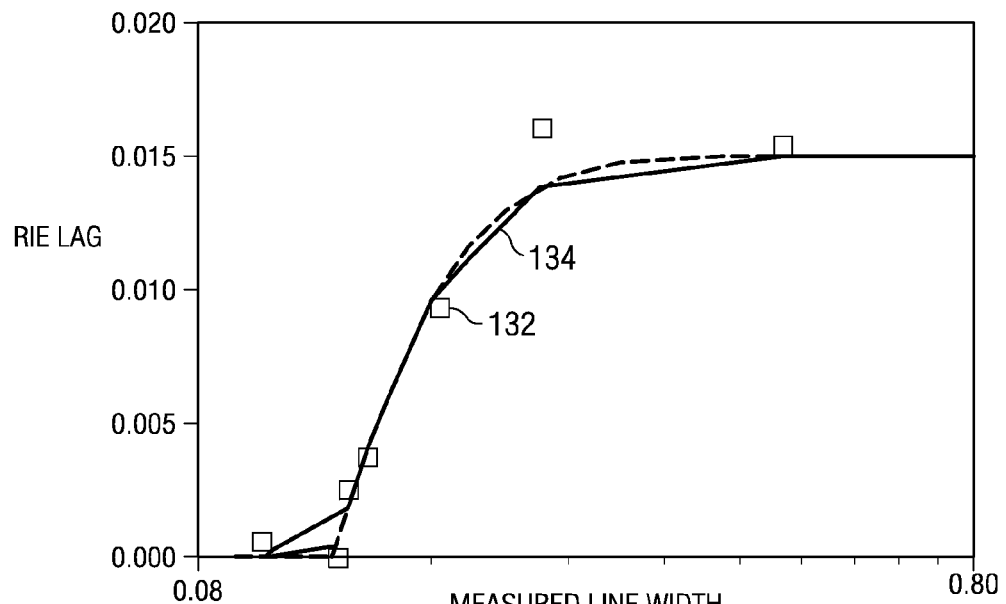
FIG. 6 is a graph showing measured and calculated values of RIE lag for a range of line widths.

FIG. 6 is a graph showing measured and calculated values of RIE lag for a range of line widths. In accordance with embodiments of the present invention, the amount of RIE lag may be measured, e.g., using the method illustrated in FIGS. 1 through 5. For example, the RIE lag x may be measured by measuring a first depth $d_1$ of a portion of the material layer 108 in the first region 104 patterned by the pattern 118a for the at least one first feature 130a of the lithography mask, and measuring a second depth $d_2$ of a portion of the material layer 108 in the second region 106 patterned by the pattern 118b for the at least one second feature 130b of the lithography mask. The second depth $d_2$ is then compared with the first depth $d_1$ to determine the amount of x, wherein $(d_2-d_1=x)$. Alternatively, the amount of RIE lag may be calculated, e.g., based on or considering a type of material of the material layer 108, a type of etchant used in the RIE process 124, an amount of time of the RIE process 124, a type of photoresist used for the layer of photosensitive material 110, and/or the size of the at least one pattern 118b for the feature 130b of the material layer 108, as examples, although other parameters may also be considered. The graph illustrates an example of measured line widths (e.g., second width $w_2$) of features 130b for a range of line widths on a log scale at 132. The graph also illustrates an example of calculated line widths $w_2$ of features 130b for a range of line widths at 134. The RIE lag x may be measured, calculated, or both, in accordance with embodiments of the present invention, for example.

Figure 7:
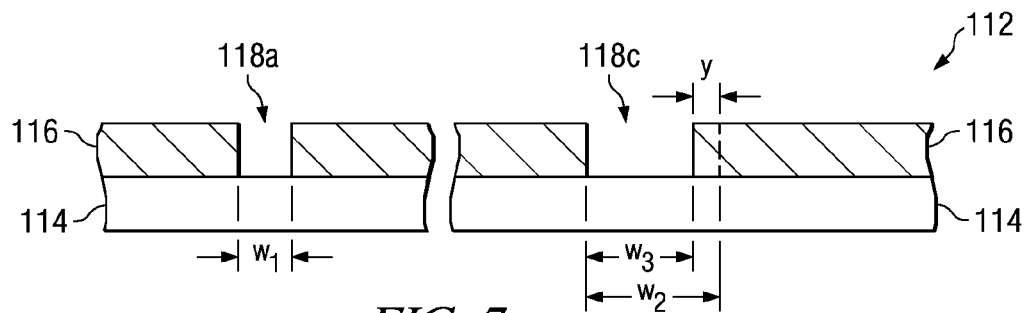
FIG. 7 shows a cross-sectional view of a lithography mask in accordance with an embodiment of the present invention, wherein patterns for wider features are narrowed to reduce the amount of RIE lag of the wider features.
Figure 8:
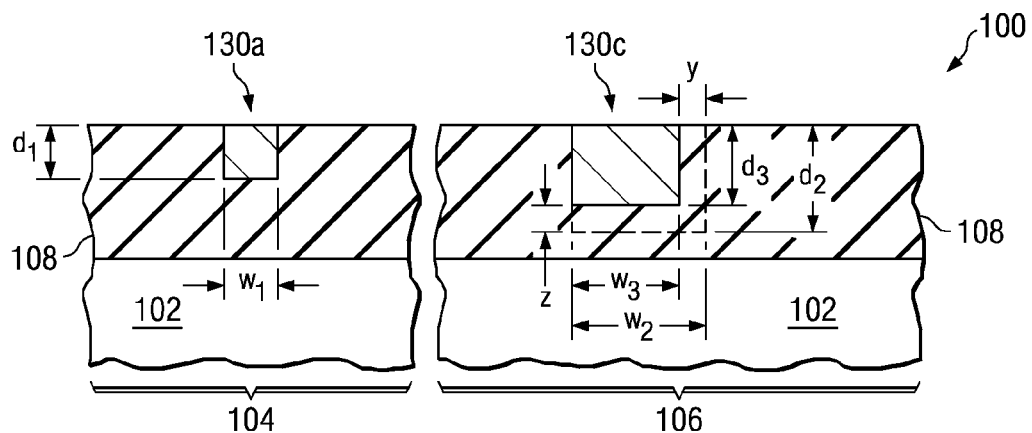
FIG. 8 shows a cross-sectional view of a semiconductor device patterned using the lithography mask of FIG. 7, wherein the reduced width results in a reduced amount of RIE lag and a reduced cross-sectional area of the wider features.

In accordance with embodiments of the present invention, the size of the larger patterns 118b in the lithography mask 112 are adjusted or decreased by an adjustment amount y (e.g., the width $w_2$ of patterns 118b of the mask 112 is decreased by adjustment amount y) to partially compensate for the amount of RIE lag x determined by calculation or measurement, or both. The adjustment amount y is a function of the amount of RIE lag x of the RIE process 124 determined. For example, FIG. 7 shows a cross-sectional view of a lithography mask 112 in accordance with an embodiment of the present invention, wherein patterns 118c for wider features are narrowed by an amount y in order to reduce the amount of RIE lag of the wider features formed on the semiconductor device 100. The second width $w_2$ of the wider patterns of the mask 112 are reduced by an amount y so that the adjusted patterns 118c of the mask 112 comprise a third width $w_3$ that is equal to the second width $w_2$ less the adjustment amount y. By reducing the desired width $w_2$ to the third width $w_3$, the amount of RIE lag is reduced and the depth of patterns formed in the material layer 108 of the semiconductor device 100 is reduced by an amount z to a third depth $d_3$, as shown in FIG. 8, which shows a cross-sectional view of a semiconductor device 100 patterned using the lithography mask 112 of FIG. 7. The reduced third width $w_3$ results in a reduced amount of RIE lag and a reduced cross-sectional area of the wider features 130c.

For example, referring again to FIG. 5, the cross-sectional area $A_{desired}$ of the desired dimension for the wide features 130b in the second region 106 may be represented by Equation 1:

$$A_{desired}=w_2*d_1. \qquad \text{Eq. 1}$$

However, due to the RIE lag in the amount of x, the actual cross-sectional area $A_{actual}$ of the wide features 130b in the second region is shown in Equation 2:

$$A_{actual}=w_2*d_2; \qquad \text{Eq. 2}$$

wherein $(d_2=d_1+x)$. Referring again to FIG. 8, advantageously, in accordance with embodiments of the present invention, the adjusted or resulting cross-sectional area $A_{adjusted}$ of the wide features 130c in the second region 106 is shown in Equation 3:

$$A_{adjusted}=w_3*d_3; \qquad \text{Eq. 3}$$

wherein $(w_3=w_2-y)$, where y is determined or derived based on the amount of RIE lag x; and wherein $(d_3=d_2-z)$, where z comprises an adjusted or reduced amount of RIE lag due to the decreased third width $w_3$ of the patterns 118c for features 130c. Thus, advantageously, the overall area, $A_{adjusted}$, is less than the actual area $A_{actual}$, in accordance with embodiments of the present invention.

Figure 9:
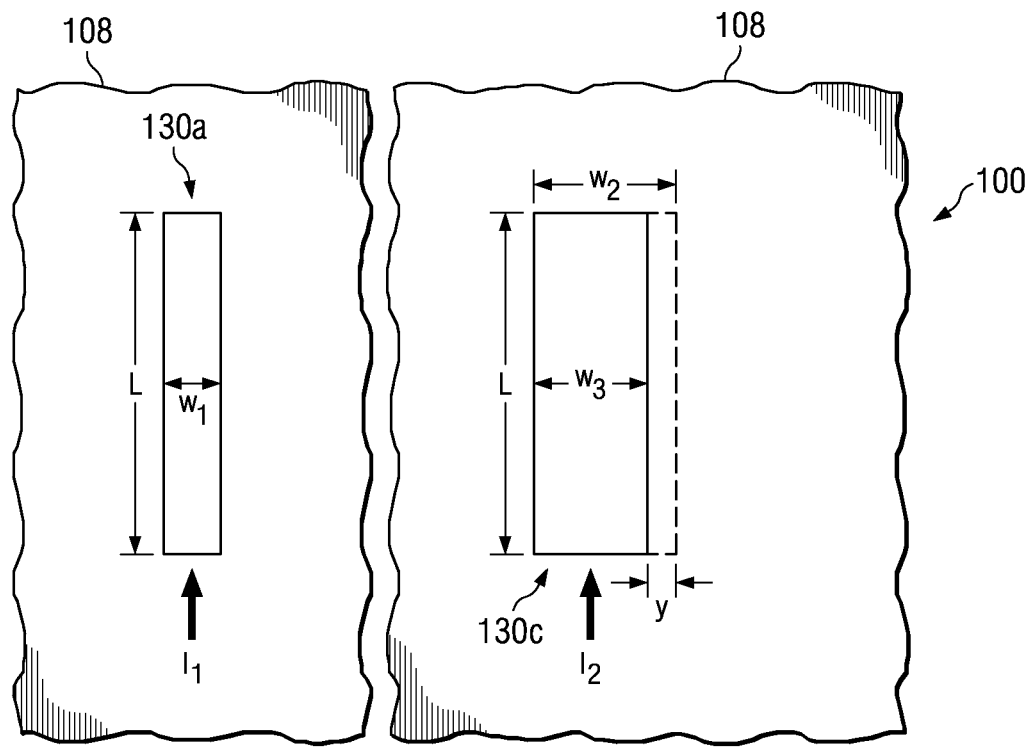
FIG. 9 shows a top view of the semiconductor device shown in FIG. 8.
Figure 10:
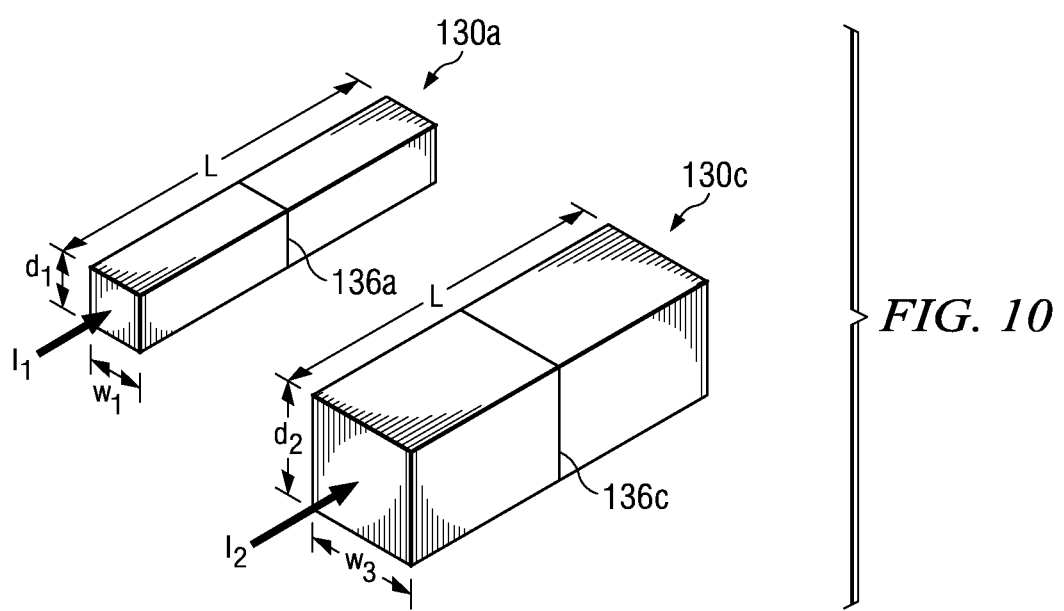
FIG. 10 illustrates a perspective view of the features of the semiconductor device shown in FIGS. 8 and 9, illustrating that the sheet resistance ($R_s$) of the wider features is advantageously reduced in accordance with an embodiment of the present invention.

FIG. 9 shows a top view of the semiconductor device 100 shown in FIG. 8. FIG. 10 illustrates a perspective view of the features 130a and 130c of the semiconductor device 100 shown in FIGS. 8 and 9. The features 130a and 130c may comprise test structures or conductive lines, wherein a current $I_1$ and $I_2$ may be caused to pass through lengthwise, e.g., across dimension L of the features 130a and 130c, e.g., during testing or operation of a circuit or device. The cross-sectional areas $(A_{130a}=w_1*d_1)$ and $(A_{130c}=w_3*d_3)$ of the features 130a and 130c, respectively, affect the amount of sheet resistance $(R_s)$ of the features 130a and 130c comprising the conductive lines or test structures, for example. Advantageously, because the area $A_{130c}$ (which is equal to $A_{adjusted}$ above) is reduced, the amount of sheet resistance $R_s$ of the feature 130c is reduced. Thus, the sheet resistance $(R_s)$ of the wider features 130c is advantageously reduced in accordance with embodiments of the present invention, for example. The sheet resistance $R_s$ of the cross-sectional area 136c along the length L of the wide feature 130c is reduced and made more close in value to the sheet resistance $R_s$ of the cross-sectional area 136a along the length L of the narrow feature 130a, advantageously.

In some embodiments, the overall cross-sectional area $A_{adjusted}$ is preferably designed and adjusted to be substantially equal to the designed cross-sectional area $A_{desired}$, for example. Thus, a feature 130c may be formed that has the desired sheet resistance of the designed feature 130b that was desired to have an area $A_{desired}$. For example, if $A_{adjusted}=A_{desired}$, then:

$$w_2*d_1=w_3*d_3; \quad \text{Eq. 4}$$

therefore, $$w_2*d_1=w_3*(d_2-z), \quad \text{Eq. 5}$$

and solving for $w_3$, Equation 6 is obtained:

$$w_3=(d_2-z)/(w_2*d_1). \quad \text{Eq. 6}$$

Thus, the value of the adjusted width $w_3$ may be determined using Equation 6. Equation 6 may be used to determine the optimum value of $w_3$ to achieve the desired area and sheet resistance, based on the calculated or measured values of z, e.g., in an iterative process.

Alternatively, replacing the value of $w_3$ in Equation 5 with "$w_2-y$" results in Equation 7;

$$w_2*d_1=(w_2-y)*(d_2-z), \quad \text{Eq. 7}$$

which may also be used to determine the value of the adjustment amount of the width y, based on values of z calculated or measured, e.g., in an iterative process.

Note that the RIE lag may be only compensated for partially in accordance with some embodiments of the present invention. If the features 130a and 130c comprise different widths $w_1$ and $w_3$, a certain amount of RIE lag will continue to exist, due to the nature of the RIE process. Unless $w_1=w_3$, for example, the amount of RIE lag will not be eliminated completely. However, in accordance with embodiment of the present invention, the size or width $w_2$ of the pattern 130b for the feature of the material layer 108 is adjusted by an adjustment amount y to partially compensate for the amount of RIE lag x of the process that would otherwise cause a large difference in the cross-sectional area and also a large difference in the sheet resistance of the features 130a and 130b, for example. Advantageously, the desired or designed sheet resistance of the features 130c may be achieved by reducing the width $w_2$ by an amount y to partially compensate for the RIE lag x, in accordance with embodiments of the present invention.

Figure 11:
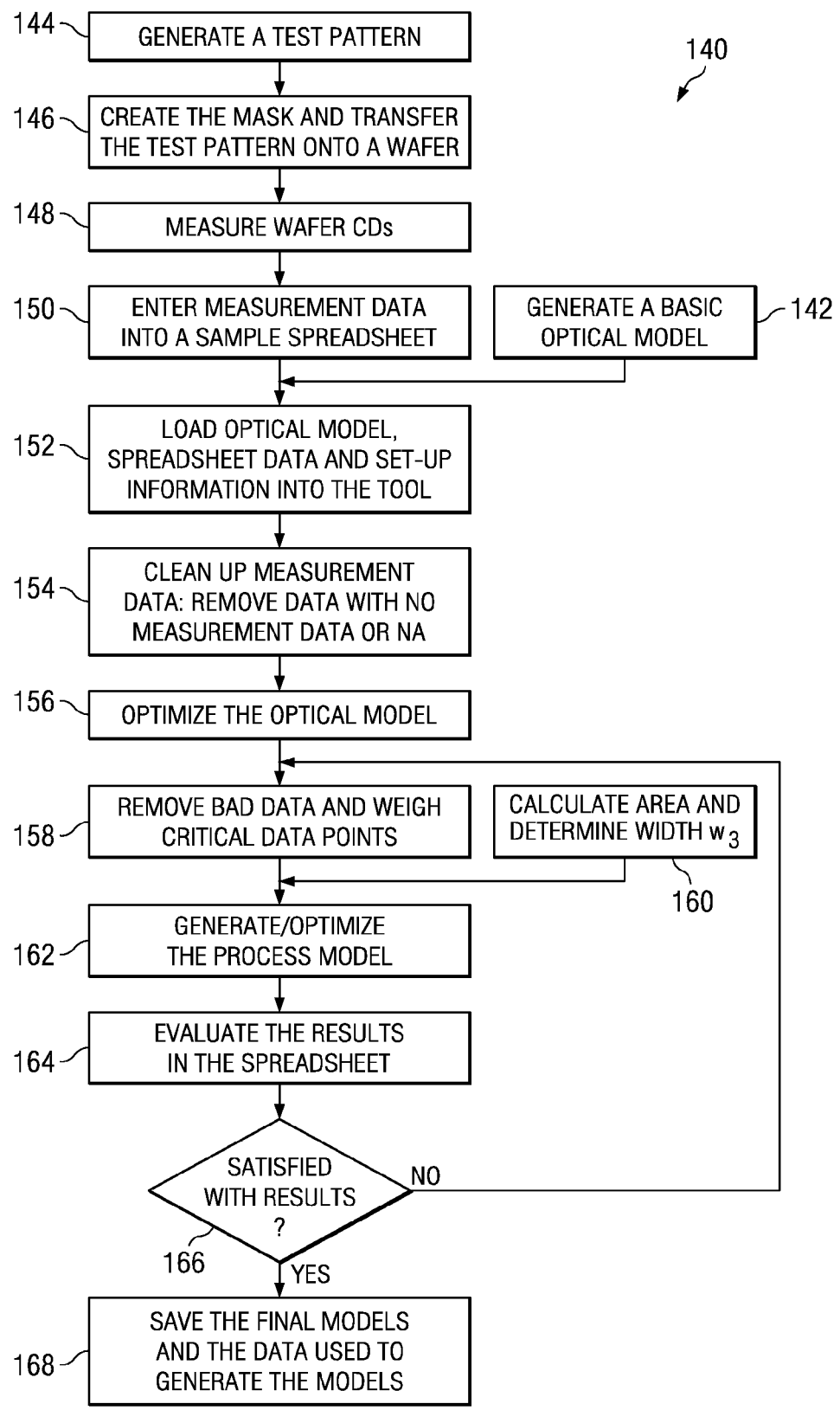
FIG. 11 is a flow chart showing an implementation of embodiments of the present invention in the design of a semiconductor device.

FIG. 11 is a flow chart 140 showing an implementation of an embodiment of the present invention in the design of a semiconductor device 100, e.g., using an OPC modeling tool. The flow chart 140 is merely exemplary of a method of implementation of the present invention; alternatively, the embodiments described herein may be implemented in other process flows, OPC methods, or semiconductor device design and manufacturing methods, for example. A basic optical model may be generated, as shown in step 142. A test pattern is generated, e.g., for features 130a and 130b shown in FIG. 5 (step 144). A lithography mask (such as lithography mask 112 shown in FIG. 1) is created and the pattern of the mask 112 is transferred to the test pattern 130a and 130b onto a semiconductor device 100 or wafer (step 146). The wafer critical dimensions (CDs) are measured, e.g., the widths $w_1$ and $w_2$ and depths $d_1$ and $d_2$ of the patterns 128a and 128b, respectively, shown in FIG. 3, are measured (step 148). The measurement data is entered into a sample spreadsheet (step 150).

The optical model from step 142 and the spreadsheet data from step 150 are loaded into the OPC modeling tool, along with set-up information (step 152). The measurement data may be cleaned up, and data with no measurement data or not applicable (NA) data may be removed (step 154). The optical model is optimized (step 156), and then bad data is removed and critical data points are weighed (step 158). The areas of the cross-sectional views of the test patterns are calculated, and the width $w_3$ is determined (step 160), as described herein, and then the process model is generated and optimized (step 162). The results in the spreadsheet are then evaluated (step 164). The results are evaluated to determine if they are satisfactory (step 166). If the results are not satisfactory, steps 158, 160, 162, and 164 are repeated. If the results are satisfactory, then the final models are saved, along with the data used to generate the models (step 168), and the information is used to generate a lithography mask such as mask 112 shown in FIG. 7 that is used to pattern semiconductor device 100 products, for example.

The adjustments to the patterns 130b described herein may be made in the design of semiconductor devices 100, the design of lithography masks 112 used to pattern semiconductor devices 100, or in OPC modeling, as examples. The adjustment techniques for RIE lag described herein may be used in OPC algorithms, for example. The adjustments to the patterns 130b described herein may also be used in conjunction with other OPC modeling, for example. At least one other OPC adjustment may be performed on the design using a modeling tool, before or after the width adjustments for patterns described herein, for example. As examples, protrusions, notches, and serifs may be formed at inner and outer corners and edges of the patterns to accommodate for other effects of the lithography process, not shown in the drawings.

In accordance with some embodiments of the present invention, an additional step is taken when performing OPC on the layout of the material layer 108 design. The additional step takes into account and makes width $w_2$ adjustments y based on the RIE lag x of the RIE process 124. In other embodiments, the adjustments to the width $w_2$ are made as part of an existing OPC algorithm that is modified in accordance with embodiments of the present invention.

Note that the lithography mask 112 shown in FIG. 1 may not actually be fabricated or used to manufacture semiconductor devices 100 in accordance with some embodiments of the present invention. Rather, the RIE lag may be calculated rather than measured. In these embodiments, the lithography mask 112 shown in FIG. 7, or another lithography mask, may be actually fabricated in accordance with embodiments of the present invention and used to fabricate semiconductor devices 100.

Embodiments of the present invention include lithography masks 112 that are adjusted to accommodate for RIE lag, in accordance with embodiments of the present invention. Embodiments of the present invention also include lithography systems that include and utilize the novel lithography masks 112 described herein.

The methods of semiconductor device 100 manufacturing, methods of OPC, lithography masks 112, and lithography systems described herein may be used to fabricate many types of semiconductor devices 100, including memory devices, logic devices, peripheral circuitry, or power applications, as examples, although other types of semiconductor devices, integrated circuits, and circuitry may be fabricated using the novel embodiments of the present invention described herein. The novel manufacturing and OPC methods may be used in patterns for features such as test structures, conductive lines, active areas, transistor gates, capacitors, inductors, vias, back end of line (BEOL) damascene line layers, and other circuit components and elements, as examples.

Embodiments of the present invention may be implemented in existing software and hardware used to generate and mask designs, or they may be implemented in new or additional software and hardware for lithography mask designs.

Embodiments of the present invention are described herein with reference to features 130a, 130b, and 130c formed using a damascene process. Embodiments of the invention may also be applied, however, to other applications where material layers 108 are patterned using subtractive etch processes, for example.

Embodiments of the present invention include methods of fabricating the semiconductor devices 100 described herein, for example. Embodiments of the present invention also include OPC methods used in the fabrication of semiconductor devices 100 and in the development of lithography mask 112 designs. Embodiments of the present invention also include semiconductor devices 100 that include the features 130c formed as described herein.

Advantages of embodiments of the invention include providing novel manufacturing methods and OPC methods that compensate for RIE lag of RIE processes in semiconductor device 100 manufacturing. The width of wide features 130b is adjusted or decreased, decreasing the amount of RIE lag for the features and providing control over the sheet resistance of conductive features 130c, for example. Embodiments of the present invention are easily implementable in existing design and manufacturing process flows, with few additional processing steps being required for implementation of the invention, for example.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:
providing a design for a layout for a lithography mask, the layout defining a pattern for a material layer of the semiconductor device, wherein the layout for the lithography mask comprises a first region comprising a first feature having a first width and a second region comprising a second feature having a second width, the second width being greater than the first width;
determining an optical proximity correction (OPC) based on a reactive ion etch (RIE) lag of a RIE process for the material layer;
altering the design for the layout for the lithography mask by the OPC determined, wherein altering the design for the layout for the lithography mask comprises decreasing the width of the second feature from the second width to a third width along an entire major side of the second feature;
fabricating the lithography mask with the altered design; and
patterning the material layer of the semiconductor device using the lithography mask.

2. The method according to claim 1, wherein patterning the material layer of the semiconductor device comprises
depositing a layer of photosensitive material over the material layer,
exposing portions of the layer of photosensitive material to energy through the lithography mask,
developing the layer of photosensitive material, and
etching away portions of the material layer through the developed layer of photosensitive material applying the RIE.

3. The method according to claim 1, further comprising forming the material layer over a semiconductor substrate, wherein the material layer is an insulating layer.

4. The method according to claim 3, wherein altering the design for the layout for the lithography mask comprises lowering a sheet resistance ($R_s$) of a cross-sectional area of a feature in the material layer, the feature comprising a conductive material.

5. The method according to claim 4, wherein patterning the material layer of the semiconductor device comprises forming a test structure, conductive line, active area, transistor gate, capacitor, inductor, test structure, or via.

6. The method according to claim 1, wherein determining the OPC comprises:
determining an amount of reactive ion etch (RIE) lag of the RIE process for the material layer of the semiconductor device; and
adjusting the design for the layout for the lithography mask to partially compensate for the amount of RIE lag determined.

7. The semiconductor device manufactured in accordance with claim 1.

8. A method of manufacturing a semiconductor device, the method comprising:

providing a design for a layout of a lithography mask, the layout defining a pattern for a material layer of the semiconductor device;

forming a test pattern on a test wafer;

determining critical dimensions $w_1$, $w_2$, $d_1$ and $d_2$ of the test pattern of the test wafer, wherein $w_1$ and $w_2$ are widths and $d_1$ and $d_2$ are related depths, and wherein $w_1$ is smaller than $w_2$ and wherein $d_1$ is smaller than $d_2$;

determining a dimension $w_3$ for the critical dimension $w_2$ of the design for the layout of the lithography mask based on a difference between $d_2$ and $d_1$, and wherein the dimension $w_3$ partially compensates for an amount of reactive ion etch (RIE) lag of a RIE process for the material layer, wherein determining the dimension $w_3$ for the critical dimension $w_2$ comprises reducing, by a distance, the critical dimension $w_2$ to the dimension $w_3$ over an entire length of a first side relative to the same length of a second side of a feature;

altering the design for the layout for the lithography mask;

fabricating the lithography mask with the altered design for the layout; and forming the pattern on a wafer applying the lithography mask.

9. The method according to claim 8, further comprising fabricating a test lithography mask with the layout and wherein forming the test pattern on the test wafer comprises forming the test pattern applying the test lithography mask.

10. The method according to claim 8, wherein determining comprises applying an optical model and the measured critical dimensions.

11. A method of optical proximity correction (OPC), the method comprising:

providing a design for a layout for a lithography mask, wherein the layout defines a pattern for a material layer of a semiconductor device, and wherein the layout comprises the pattern for a first feature having a first width and the pattern for a second feature having a second width, the second width being greater than the first width;

determining an amount of reactive ion etch (RIE) lag of a RIE process for the material layer of the semiconductor device between the first feature and the second feature; and reducing the second width to a third width of the second feature of the design for the layout for the lithography mask thereby partially compensating for the amount of RIE lag determined, wherein reducing the second width to the third width of the second feature comprises reducing the second width over an entire length of a side relative to the same length of an opposite side of the second feature by a distance.

12. The method according to claim 11, wherein the method comprises using a modeling tool to determine an amount of reduction for the RIE lag.

13. The method according to claim 12, further comprising performing another OPC adjustment on the design of the layout for the lithography mask using the modeling tool.

14. The method according to claim 12, wherein determining the amount of reduction for the RIE lag comprises calculating an area of a cross-section of the pattern formed during the RIE process, and determining a reduced width for the pattern of the second feature.

15. The lithography mask manufactured applying the OPC according to claim 11.

16. The lithography mask according to claim 15, wherein the lithography mask comprises a binary mask, a phase shifting mask, an alternating phase shifting mask, an attenuating phase shifting mask, a bright field mask, a dark field mask, an immersion lithography mask, or combinations thereof.

17. A lithography system including the lithography mask of claim 15.

18. The lithography system according to claim 17, wherein the lithography system is configured to utilize ultraviolet (UV) or extreme UV (EUV) light, an optical lithography system, an x-ray lithography system, an interference lithography system, or an immersion lithography system.

* * * * *